United States Patent [19]

Klemmer et al.

[11] Patent Number: 4,810,154

[45] Date of Patent: Mar. 7, 1989

[54] COMPONENT FEEDER APPARATUS AND METHOD FOR VISION-CONTROLLED ROBOTIC PLACEMENT SYSTEM

[75] Inventors: Robert A. Klemmer, Wheeling; Steven F. Wright, Glen Ellyn, both of Ill.

[73] Assignee: Molex Incorporated, Lisle, Ill.

[21] Appl. No.: 159,617

[22] Filed: Feb. 23, 1988

[51] Int. Cl.$^4$ .................. B65H 16/00; B65G 25/00
[52] U.S. Cl. .................. 414/222; 414/223; 414/416; 901/7; 198/855
[58] Field of Search .............. 414/222, 223; 901/7; 198/340, 341, 502.3, 858, 859, 855, 857; 269/63

[56] References Cited

U.S. PATENT DOCUMENTS

| | | | |
|---|---|---|---|
| 4,105,925 | 8/1978 | Rossol et al. | 901/7 X |
| 4,527,326 | 7/1985 | Kohno et al. | 414/223 X |
| 4,606,117 | 8/1986 | Takahashi et al. | 414/223 X |
| 4,610,083 | 9/1986 | Campisi et al. | 414/225 X |
| 4,633,370 | 12/1986 | Hamuro et al. | 361/380 |

FOREIGN PATENT DOCUMENTS

| | | | |
|---|---|---|---|
| 0093113 | 4/1987 | Japan | 198/502.3 |
| 894022 | 4/1962 | United Kingdom | 198/341 |

*Primary Examiner*—Robert J. Spar
*Assistant Examiner*—Gary Cundiff
*Attorney, Agent, or Firm*—John W. Cornell; Louis A. Hecht

[57] ABSTRACT

An improved apparatus and method for feeding a large volume of electrical components to a vision controlled robotic placement apparatus is provided. Electrical components in a reeled pocketed carrier tape are indexed along a dereeling component feeder to a pick up station. Forward advance of the carrier is stopped when an optical sensor in the feeder senses that a depending pocket in the carrier tape is generally positioned at the pick up station. The vision control system on the robot is relied upon to locate the pocket at the pick up station and to locate the individual components presented in the pocket. The components are robotically unloaded from the carrier one at a time and placed on a printed circuit board assembly at a second station with the guidance of the vision control system. As the last component is picked up for placement, the vision control system signals the carrier tape drive to index the next pocket to the pick up station. In accordance with the invention, multiple parts may be presented in each pocket. The carrier tape and feeder are less precise and much less expensive because the vision system is relied upon to perform the location functions required for accurate robotic parts acquisition and placement.

5 Claims, 5 Drawing Sheets

COMPONENT FEEDER APPARATUS AND METHOD FOR VISION-CONTROLLED ROBOTIC PLACEMENT SYSTEM

BACKGROUND OF THE INVENTION

The present invention relates to a new and improved method for feeding a large volume of electrical components to a vision controlled robotic placement apparatus. More particularly, it relates to an improved carrier tape and feeder which are responsive to an optical sensor and to directions from the vision system of the robot to provide a large number of electrical components to a robot placement apparatus in a low cost, lost space requirements operation.

Reeled carrier assemblies for transporting and supplying a large number of electronic components are known. The carrier assembly typically comprises a flexible substrate tape including a plurality of spaced apart component receiving pockets which extend transversely across the tape. The pockets are provided in spaced apart parallel relationship along the length of the tape. The component receiving pocket may be vacuum formed to receive particular electronic components in a dedicated orientation. A releaseable cover tape is applied to the top surface of the carrier substrate tape to retain the electronic components in the pockets. The covered carrier tape can be wound upon a reel until it is unreeled for further processing. Carrier assemblies of this type can support several thousand electronic components in a very compact manner.

Carrier tape assemblies have been used in the past to feed a large number of components to a pick up station where they are picked up by a robotic assembly apparatus and positioned in an appropriate location on a printed circuit substrate. In these prior art robotic assembly machines, a tape indexer mechanically positions a component receiving cavity at a precisely located pick up station for pick up by a robot arm. Exact positioning of the component at the pick up station in these mechanically controlled delivery systems is extremely important so that the programmed robot may always find the electronic part and grasp it at desired locations. The robot arm relies upon the fact that the part will always be exactly located within its grasp, so that it can place the component in an exact location on a printed circuit board. The carrier tape must be prepared with needed accuracy to ensure accurate robotic placement of parts onto the printed circuit board.

To ensure precise mechanical indexing of the parts to the robotic pick up station, the carrier tapes are carefully prepared to accurately provide the component receiving pockets at equally spaced distances along the tape. Moreover, sprocket feeding holes must be precisely positioned on the edges of the tape with respect to each other and with respect to the component receiving pockets. The prior art carrier tapes are generally fed by a mechanical sprocket indexer which relies upon the inherent information stored in the tape to guarantee that a pocket and therefore a single part contained therein is precisely positioned at a robotic pick up station.

In these mechanical indexer arrangements, the cost of providing the precise carrier tape packaging is undesirably high. The sprocket holes and vacuum formed contoured component receiving pockets must be formed at precise locations along the tape within extremely close manufacturing tolerances which increases the cost of manufacture. Illustrative examples of prior mechanically indexed sprocket-hole carrier tapes and indexing feeders for use therewith are shown in U.S. Pat. No. 4,633,370 and U.S. Pat. No. 4,610,083, as well as, European publication No. EP0223505-A.

Visual guidance systems for controlling robot arm movements are now also known. A visual guidance or control system includes image receiving means typically in the form of a video camera which is capable of receiving an image and transmitting it to analyzing vision control equipment. The camera or other image obtaining means is typically mounted on the end of a robot arm to provide visual information about the locations adjacent the end of the arm. The image may be digitized and/or analyzed by vision control programming and equipment to provide guidance instructions to the robotic drive means controlling the movement of the robotic arm.

Visually guided robot arms have been used in robotically assembling electrical components to printed circuit boards. In these prior art arrangements, parts are fed to a robotic pick up station in organized rigid trays. The trays include a rigid tray substrate provided with a predetermined matrix of discrete pockets for receiving a number of components to be mounted on the printed circuit board. The parts are loaded into the pockets one part per pocket, all in the same orientation. Alternatively, the rectangular tray can include a plurality of elongate spaced apart troughs extending the length thereof into which a linear array of electrical components are positioned for pick up.

In accordance with these prior art arrangements, an individual operator loads a filled tray onto a loading apparatus which then automatically moves the loaded tray to a pick up station to positively position the tray in the pick up station. The visually guided robot then picks the parts from the tray one at a time and places them on a printed circuit board. In most of these prior art methods, the positive positioning of the tray, and therefore its pockets and packaged components, guarantees the mechanical positioning of the part for the robot arm. The visual guidance systems on these robot arms are used alone or in combination with fiducial marks provided on the target printed circuit substrates to aid the robot in properly positioning the part on the printed circuit board. The emphasis for using the visual guidance system has been for part mounting accuracy as opposed to parts acquisition.

A number of disadvantages for the prior art tray arrangement exist. The trays themselves only hold a limited number of parts. They take up a large amount of real estate or area immediately adjacent the robotic arm, especially in view of the limited number of parts that can be delivered. A separate loaded tray indexing apparatus is needed which adds considerably to the cost of using the trays.

U.S. Pat. No. 4,527,326 describes a visually guided robotic system for guiding a robot arm which indentifies and locates properly oriented or particular parts from among many parts presented along a delivery track extending from a vibratory bowl feeder.

Prior art carrier tape feeders which unreel a carrier tape and peel or pull back the adhesively applied cover tape before indexing the tape to present one pocket at a time at a pick up station are known, from the above-identified patents and numerous other citations. They all rely on sprocket feed holes and mechanical indexing sprocket drive means for indexing the tape one pocket at a time, with the above mentioned disadvantages. The use of vision control systems for accurately placing parts on a printed circuit board is now well known however, vision control systems have the capability of accurately guiding a robot arm to acquire parts as well, and this capability has not been fully exploited.

Accordingly, it is desireable to incorporate the advantageous features of carrier tape supply assemblies including their ability to successively provide a large number of parts at a pick up station without taking up alot of space immediately adjacent a robot, but without the associated packaging costs. It is also desireable to incorporate some of the features of the prior art tray arrangements including their ability to provide a plurality of components per pocket and to use the visual guidance system on a robot arm for parts acquisition as well as parts placement but without the associated cost and manpower requirements previously associated with tray feeds.

SUMMARY OF THE INVENTION

Accordingly, it is an object of the present invention to provide a new and improved component feeding apparatus which overcomes the disadvantages of prior art mechanically positioned carrier tape and tray feeding apparatuses for use in a vision controlled robotic placement apparatus.

In accordance with this and other objects the present invention provides a new and improved arrangement for automatically moving electrical components from a first station to a second station. The arrangement includes a first station whereat a plurality of electrical components are delivered for movement. Component feeder means are provided for supplying electrical components to said first station. The component feeder means includes a reeled carrier supply of electrical components having a continuous carrier tape with spaced apart componentreceiving pockets defined therein and extending the length thereof, electrical components disposed in said pockets and indexing means for positioning one pocket at a time at said first station.

The arrangement further includes a second station spaced from the first station whereat electrical components moved from said first station are positioned.

A robotic mover means including a robot arm having a free end and gripper means for gripping an electrical component mounted on the free end is provided. The gripper means is actuable between a closed gripping position and an open release position. Gripper control means are provided for actuating the gripper means between said open and closed positions. Moreover, arm drive means for moving the free end and gripper arm between the first station and the second station are provided.

A vision system control means for obtaining visual information at the first and second stations, analyzing said information and directing the robot arm drive means and gripper means on the basis of said analyzed visual information is also provided.

The improvement in accordance with the present invention in the component feeder means comprises a carrier tape having pockets receiving a plurality of similar electrical components in a single orientation. In addition, said indexing means includes a carrier tape drive path extending through said first station, a tape drive means for moving the carrier tape along said drive path toward the first station actuable between an on position and an off position, and drive control means for actuating the tape drive means between said on and off positions. The indexer further includes optical sensing means disposed adjacent said drive path at the first station for sensing when a pocket is located at the first station, whereupon said drive control means actuates the tape drive means to said off position in response thereto and said drive control means actuates the tape drive to said on position in response to a direction from the vision system control means.

In accordance with the present invention it has now been discovered that the vision control system on the robot arm may be used to find and precisely locate a pocket and an electrical connector presented in a pocket in modified carrier tape. In accordance with this invention, relying on the vision system in a robotic parts acquisition step now permits the use of a carrier tape and feeder arrangement which is extremely inexpensive to prepare and use. In accordance with the present arrangement and method, the vision control system on the robot arm locates the pocket and locates one part in the pocket out of the multiple parts presented in each pocket. Multiple connects may now be presented to an unloading station in each pocket.

The carrier tape does not have to be precisely positioned at a pick up station for the visual system to find the pocket and the parts. No costly manufacturing is required to prepare a precisely dimensioned and configured carrier tape for feeding a large number of parts to the unloading station. The component receiving pockets formed in the carrier tape do not have to be equi-distantly spaced from another within very close manufacturing tolerances. Instead, in accordance with the present arrangement, the pockets in the carrier tape may be spaced at random spacing along the length of the tape. No precise positioning of sprocket feed holes with respect to each other and the pockets contained in the tape is required. As a result, all of the manufacturing problems and prohibitive costs associated with prior art mechanically indexed carrier tapes can now be avoided in accordance with the present arrangement.

In accordance with the present invention, the component feeder indexer for supplying a large number of components on a carrier tape may also be modified to a simpler and less expensive form. In the modified parts feeder of the present invention, the advance of the carrier tape is stopped at only a general location at the pick up station by means of an optical sensor disposed along side the pick up station and the tape feed path. In the preferred embodiment the optical sensor is a proximity sensor which includes an optical transmitter and an optical receiver located on one side of the tape feed path positioned so that a pocket advanced into the pick up station will reflect light transmitted by the transmitter to the receiver. This is effective to send a signal to the drive control means to stop the drive motor means. Alternatively, an optical transmitter and optical receiver may be aligned on opposed sides of the tape feed path at a position below the upper surface of the carrier tape. Optical sensing by beam interruption may be accomplished by relying on the parts in the depending pocket to block the light beam, or in the alternative, the end walls of the carrier tape pocket adjacent the transmitter may be made optically opague in order to block the light beam to generate a stop signal.

In accordance with the present arrangement, the visual guidance system on the robot arm is programmed with the commercially available programming software provided with these vision control systems. The vision system is programmed to locate the carrier tape pocket at the pick up station. The vision system control means on the robot arm is programmed to first view the entire trough or pocket at the pick up station to determine whether or not any connectors are presented. If parts are visually detectable in the pocket presented, the vision system is programmed to find the first edge of the first connector, positioned in the trough, viewing each pocket from either left to right or right to left. Given this reference, further programming information regarding the connector length, or circuit size, provided to the vision control means enables the vision system to direct the gripping fingers on the robot arm to grasp the first connector in the mid section for pick up.

After the robot arm and gripper acquire the part, the vision control system directs the robot arm to show the gripped connector to a second visual sensing means which examines the part from the underside. The second image is examined by the vision system to determine where the gripper means has gripped the part and locates distinguishable depending features of the connectork i.e., mounting pegs, solder tails or surface mount contacts. The vision system analyzes the second image and compares the actual grip on the part to a nominal grip and makes a calculated internal positioning correction.

After the vision system has controlled acquisition of the connector in the gripper and after the position of the gripped part has been recorrected and fine tuned, the vision system knows precisely where the part is with respect to the robot arm. Thereafter, the robot arm control moves the robot arm to the second station and to a general programmable location on the printed circuit board where the part is to be placed. The vision system again takes over and either aone or by using fiducial marks provided on the printed circuit board during the printing step, precisely locates the site on the circuit board which is to receive the part. The vision system then guides the robot arm to place the positively located part to the positive or exact position on the board.

Thereafter, in accordance with programmed vision control methods, the robot arm returns to the pick up station. The vision control means again views the connector pocket to determine whether or not any connectors are left. If connectors are present in the pocket, the visual guidance system locates the first edge of the second connector in order to direct the robot arm to pick up the connector at its mid section for pick up. The second connector is shown to the second imaging means for positional fine tuning and is thereafter placed at an analyzed position on a printed circuit board.

The process is repeated until, upon return to the pick up station, the vision control means identifies that the last connector in the pocket is being picked up. After the last connector is gripped and removed, the vision control means is programmed to send a signal to the tape feeder drive control means which actuates the drive control from its off position to its on position to advance the tape. The carrier tape advances until the optical sensing means in the feed track identifies that the next conector pocket has been presented to the unloading station which stops the tape drive.

In accordance with the present invention, information obtained from an optical sensor and a vision system control means cooperate with the drive control means to selectively index the carrier tape. The present arrangement also provides other distinct advantages.

More particularly, instead of having one part per pocket, several parts can be loaded into each pocket. This increases the number of connectors that can be handled by the arrangement.

As has been mentioned above, relying on the vision control system for obtaining the parts from the carrier tape provides several distinct advantages in terms of cost for the overall system. The carrier tape can be made with very broad manufacturing tolerances because pockets don't have to be exactly equally spaced along the carrier and no precisely spaced sprocket feed holes are required.

The vision control system is used to locate the pocket and the part for grasping. As a result, the indexing means may now be less precise. The feeder simply has to deliver a pocket of parts in the general vicinity where vision system expects to find them for pick up and the vision control system does the rest.

Moreover, a single tape may be prepared which is configured to receive a particular connector type, such as a D-subminiature type connector, for example. Thereafter, the same carrier tape may be used to score and deliver a plurality of similar D-sub connectors for placement, regardless of their circuit size. The same carrier tape may be used for 25 circuit D-subs, as well as, for 9-circuit D-subs. The feeder arrangement of the present invnetion also provides for easy changeover for placement of a new connector type. The vision system programming information required for a changeover from one part or circuit size to another can be stored on tape or disk. The programming changeover may be simply plugged into the system. An earlier tape can be rereeled and removed from the feeder and a new tape slid in place without a need for hardware changeover and machine downtime.

In accordance with the present invention, a new and improved method and component feeder arrangement for feeding parts to a vision controlled robotic placement apparatus is provided which delivers a large number of parts at cheaper cost in an arrangement which does not require a large amount of real estate adjacent the robot.

Other objects and advantages provided by the present invention will be apparent from the following detailed description taken in conjunction with the drawings in which:

DETAILED DESCRIPTION OF THE PREFERRED EMBODIMENT

Figure 1:
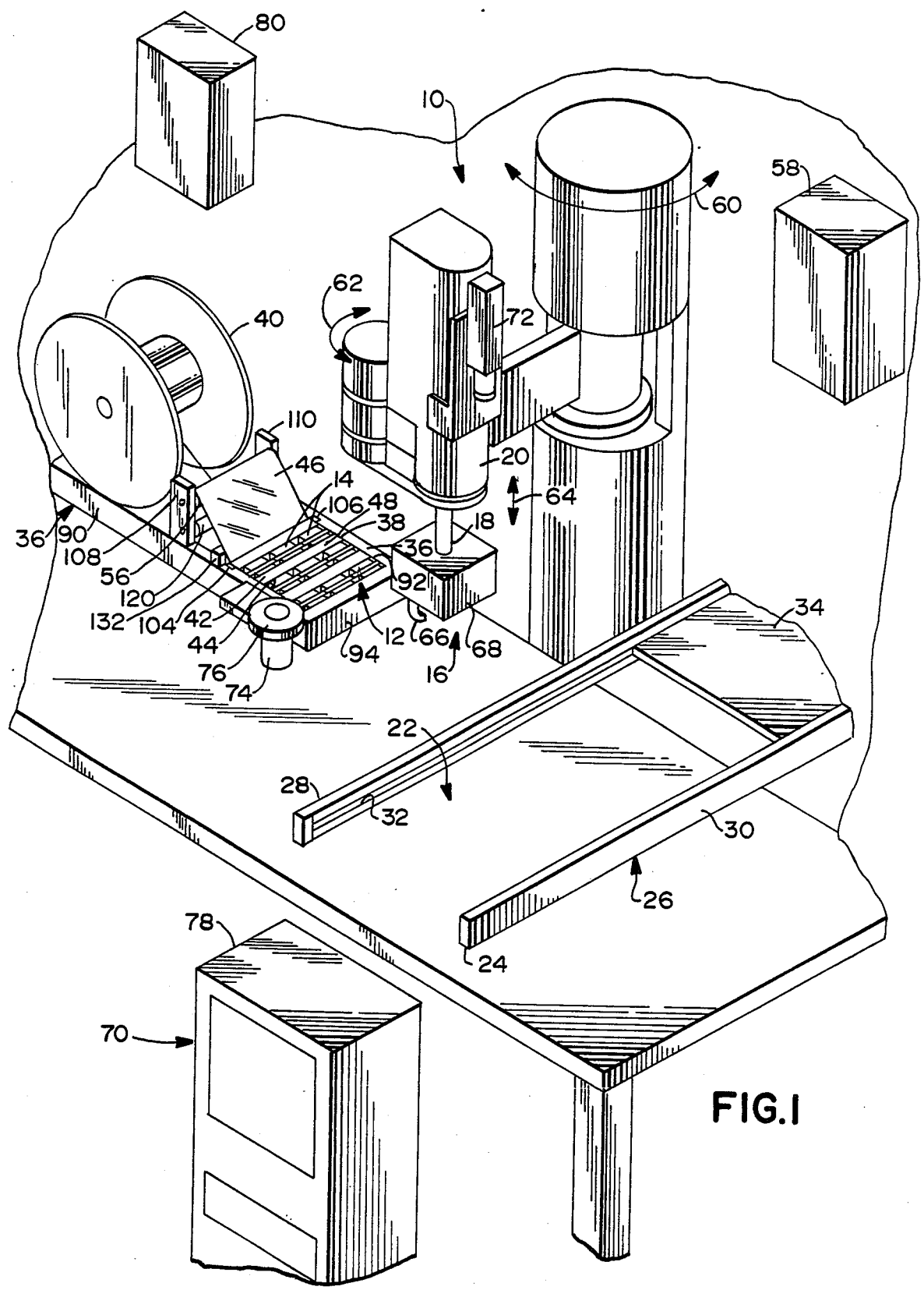
FIG. 1 is a perspective view of the new and improved component feeder arrangement of the present invention shown in use with a vision system controlled robotic placement apparatus.
Figure 2:
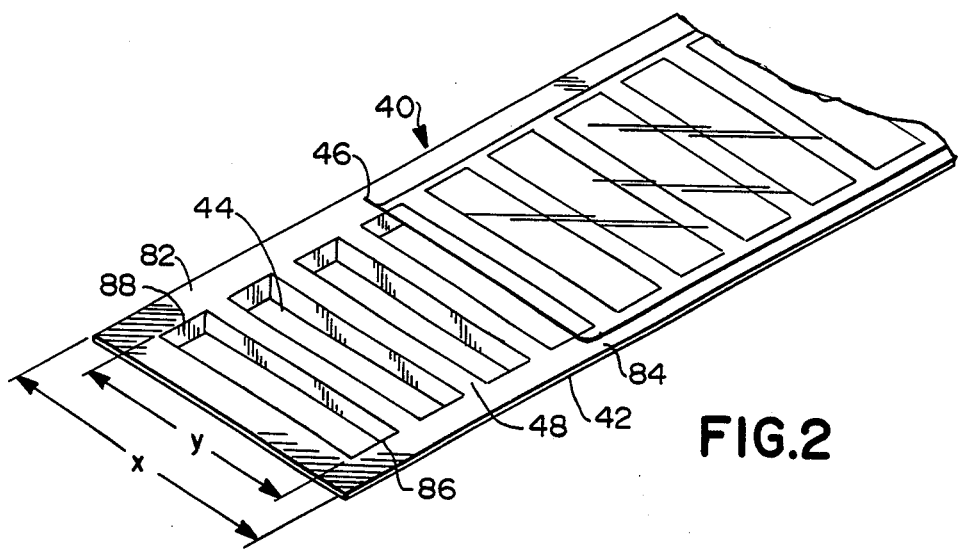
FIG. 2 is a perspective view of the new and improved reelable carrier assembly for use in the component feeding arrangement of this invention.

The present invention provides a new and improved arrangement for automatically moving electrical components from a first station to a second station. Referring now to FIG. 1, the new and improved arrangement 10 is shown in use in a vision controlled robotic placement apparatus for making printing circuit board assemblies. Arrangement 10 includes a first station comprising a robotic pick up station 12 where electrical connectors 14 are delivered for pick up by a gripping end effector 16 mounted on the free end 18 of a robot arm 20. Arrangement 10 also includes a second station comprising a printed circuit board component mounting station 22. Mounting station 22 is spaced from pick up station 12 adjacent robot arm 20. Mouting station 22 is defined at an end 24 of a printed circuit board mounting guide 26 including a pair of opposed guide rails 28 and 30 each including a rectangular groove or notch 32 adapted to slideably receive and guide a printed circuit board 34 into mounting station 22.

Pick up station 22 is defined adjacent one end of a dereeling component feeder 36 having a hairpin or U-shaped tape feed path 38 extending along the top surface of feeder 36 and returning along the underside thereof. A reeled carrier assembly 40 including a continuous flexible carrier tape substrate 42 having a plurality of spaced apart component receiving pockets 44 extending the length of carrier tape 42 is mounted onto the rear end of feeder 38. Pockets 44 each receive a plurality of electrical components or connectors 14. As shown in FIG. 1, three D-subminiature type electrical connectors are mounted in each pocket 44 in a uniform orientation. Connectors 14 are retained in pockets 44 by a releasable cover tape 46 adhesively applied to the upper surface 48 of carrier tape 42.

Component feeder 34 includes a tape drive motor 50 (FIG. 7) for rotating a pair of spaced apart frictional drive wheels 52 and 52 (FIG. 7 and 8) for advancing carrier tape 42 along tape feed path 36 and through pick up station 12. Empty carrier substrate tape 42 is returned along the lower side of tape feed path 36 for take up on a substrate tape take up bobbin or reel (not shown). The cover tape 46 is peeled off of substrate 42 at a location along feed path 36 upstream from pick up station 12 for take up on a cover tape reel or bobbin 56.

Robot arm 20 is an articulating robot arm which may be moved by a robot drive means 58 in the direction of arrows 60, 62 and 64. A gripping end effector 16 positioned on the free end 18 of robot arm 20 includes gripper jaws 66 for grasping each electrical connector 14. A gripper control means 68 for actuating the gripper jaws 66 between an open released position and a closed gripping position is mounted on free end 18. Robot arm 20 is controlled by a robotic arm drive means 58 which can direct and manuever the free end 18 of robot arm 20 to pick up station 12 to pick up a connector 14 and move it to the printed circuit board mounting station 22 to precisely position the gripped electrical component 14 in position on a printed circuit board 34.

The robot arm 20 and robot drive means 58 are further controlled or directed by a vision system control means 70. Vision system control means 70 includes means for obtaining visual information at the first and second stations 12 and 22 including a first video camera means 72 mounted on the free end 18 of robot arm 20. A second video camera means 74 is located adjacent pick up station 12. Second camera means 74 as shown includes a surrounding fluorescent lamp 76 which is provided to further illuminate the underside of connector 14 during pick up and placement.

The vision system control means 70 includes controller module 78 for analyzing the visual information received from cameras 72 and 74 and it further includes output means for directing the robot arm drive means 58 and gripper control means 68 on the basis of the analyzed visual information. The vision system control module 78 in accordance with the present invention may also send a directed signal to the drive control means 80 in the component feeder 36 to turn the tape drive motor 50 on to advance or index the next filled component pocket 44 in tape 12 to the pick up station 12.

Figure 5:
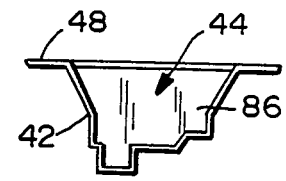
FIG. 5 is a side elevation view of the reelable carrier assembly showing a contoured component receiving pocket defined therein.
Figure 3:
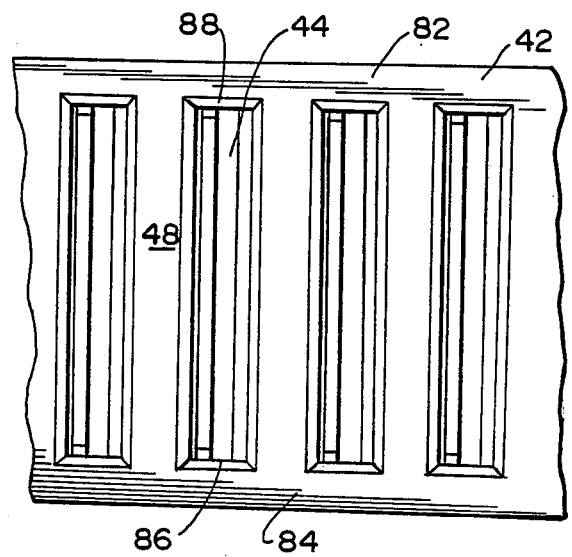
FIG. 3 is a top plan view of the reelable carrier assembly.

Referring now to FIGS. 2-5 a new and improved reelable carrier assembly 40 for use in arrangement 10 of the present invention is shown. Carrier tape 42 is formed from a flexible, optically transmissible thermoplastic material which may be vacuum formed in accordance with conventional methods to allow depending connector receiving pockets 44 including a profile as shown in FIG. 5 which is adapted to receive connectors 14 mounted therein in a single or dedicated orientation only.

The carrier substrate tape 42 is provided with a width X and connector receiving pockets 44 extend transversely across the tape provided with a shorter width Y to provide side strips 82, 84 extending longitudinally along opposed sides of the tape. Side strips 82 and 84 are not provided with precisely positioned sprocket feed holes but they are positioned for engagement by the frictional drive roller 52 and 54 in order to advance the tape 42 within the U-shaped feed path 38.

The exact spacing between adjacent component receiving pockets 44 along the length of the carrier tape 42 may be variable. Each pocket 44 is an elongate trough adapted to receive a plurality of similar connectors of the same general type.

In the embodiment shown in FIGS. 2-5, connector receiving pockets 44 have been vacuum formed to define a profiled pocket 44 for receivng a D-subminiature type connector. An important feature of this new and inexpensive reuseable carrier tape 42 is that tape 42 may be used to supply D-subminiature connectors of different circuit sizes for pick up at the pick up station 12. More particularly, each connector receiving pocket 44 may house two 25 circuit D-sub connectors and, alternatively, the same tape 42 and pocket 44 may be used to feed three 9-circuit D-sub connectors.

Figure 4:
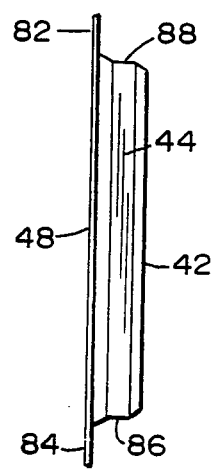
FIG. 4 is a front elevation view of the reelable carrier assembly.

Referring now to FIGS. 4 and 5, connector receiving pockets 44 depend from the upper surface 48 of carrier tape 42 to a distance below the upper surface 48. Each depending pocket 44 includes a pair of opposed end walls 86 and 88 extending generally perpendicularly of the upper surface of the tape 42. In the side elevation view shown in FIG. 5, it is apparent that the end walls of each pocket form depending surface from the carrier tape which may be used either to reflect transmitted light or to interrupt a light beam provided by an optical sensor.

In accordance with the present apparatus and method, an optical sensor is located so that the passage of a depending pocket and particularly an end wall 86 will either reflect or interrupt a light beam disposed adjacent the feed path 38 to signal that a pocket 44 has generally been positioned at the pick up station 12. Precise positioning of the pocket 44 or the part at pick up station 12 is no longer required because the vision system 70 is relied upon to locate the pocket 44 and the parts 14 in the pocket 44 during a parts acquisition step.

Figure 6:
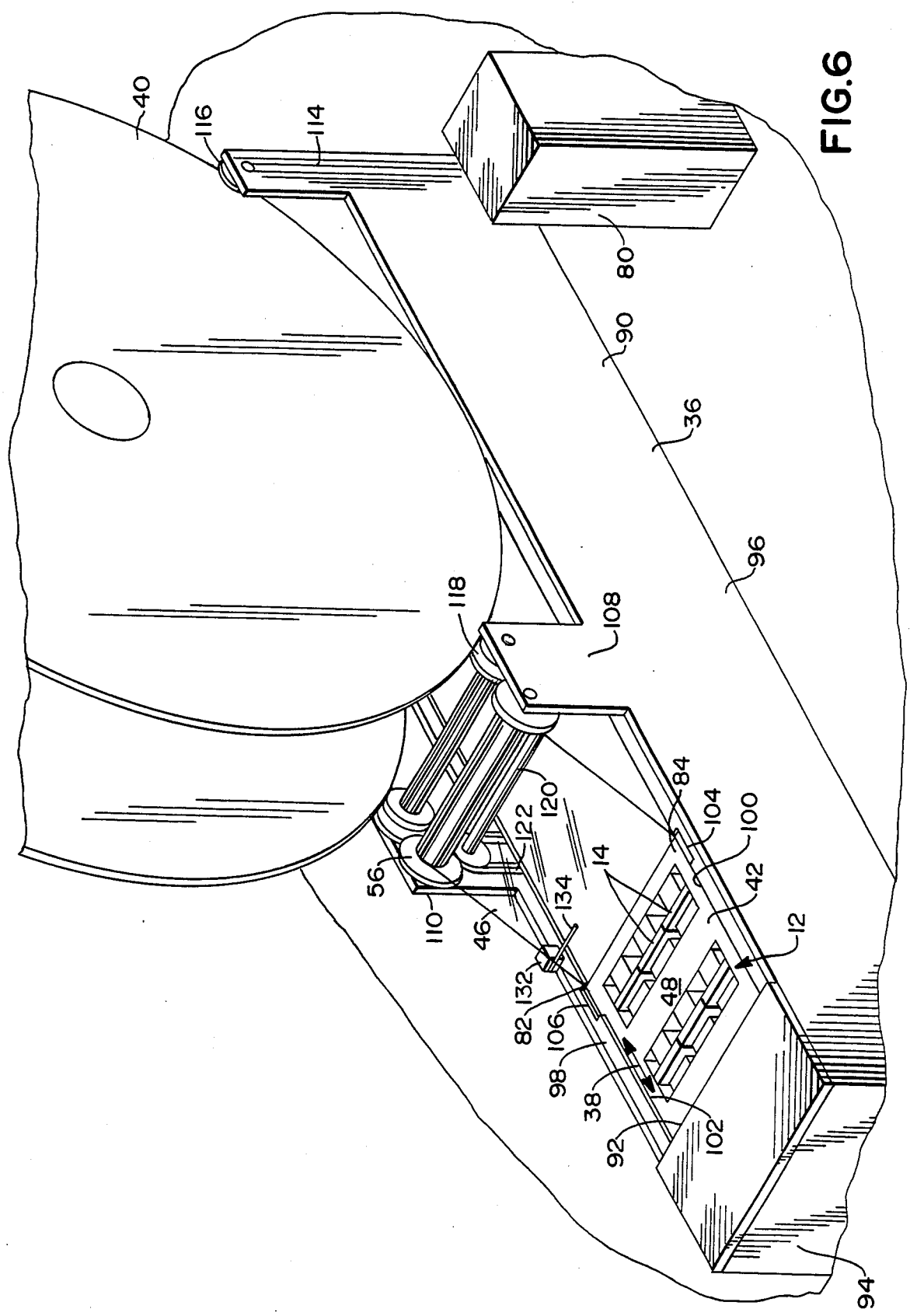
FIG. 6 is a perspective view of the new and improved indexing means for use in the arrangement of the present invention.
Figure 7:
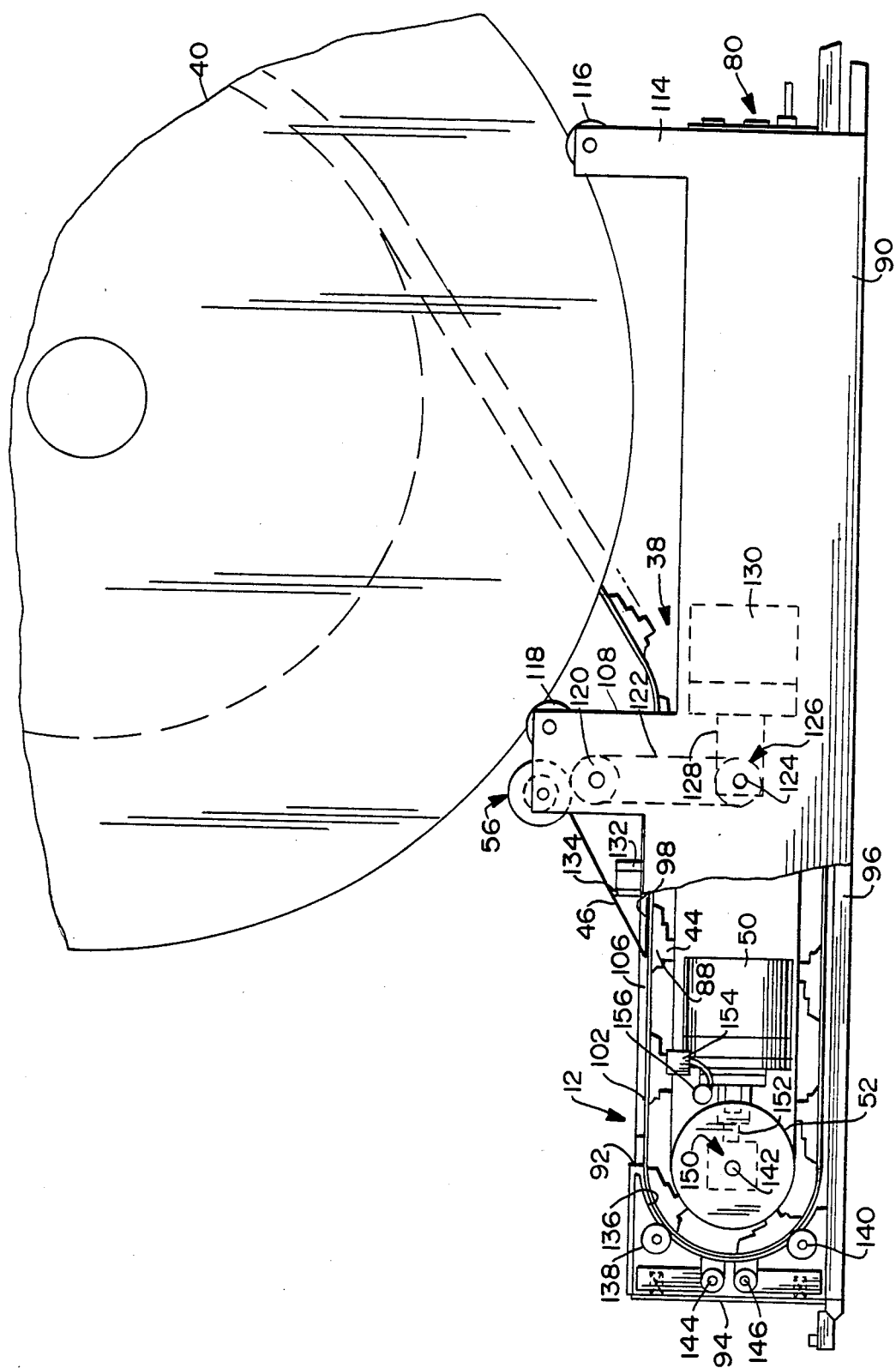
FIG. 7 is a side elevation view of the indexing means partially cut away to show the tape feed path, drive means and sensing means in greater detail.
Figure 8:
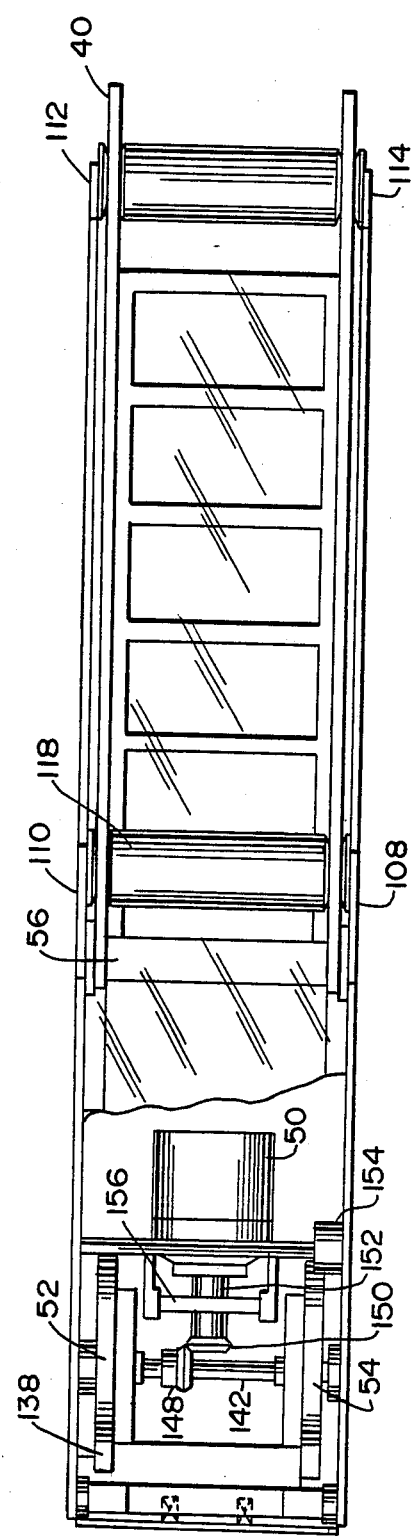
FIG. 8 is a top plan view of the indexer, partially cut away to show the tape drive and motor in greater detail.

In accordance with the present invention the new and improved reelable carrier assembly 40 is fed to a robotic pick up station by a new and improved simplified dereeling component feeder 36. Referring now to FIGS. 6–8, the new and improved modified dereeling component feeder 36 is shown. Dereeling component feeder 36 includes an elongate generally rectangular base or frame 90 having an open top 92. A generally U-shaped or hairpin tape drive path 38 extends along the top surface of the frame 90, turns 180 degree turnaround at the front end 94 and returns along the bottom side 96 (FIG. 7) of the feeder frame 90. A pair of inwardly extending shoulders 98, 100 including a carrier tape groove 102 are provided on opposed sides of open top 92 from a point intermediate the length of frame 90 toward the front end 94. A pair of opposed elongate rectangular peel back openings or notches 104 and 106 extend between respective grooves 102 and the upper surfaces of shoulders 98 and 100 as shown.

Two aligned pairs of spaced apart mounting projections 108, 110 and 112, 114 extend upwardly from spaced apart locations on the mounting frame 90. A pair of idler rollers 116 and 118 adapted to receive reeled carrier assembly 40 and to mount it for rotation on frame 90 extend between mounting projections 108, 110 and 112, 114, respectively. A cover tape take up bobbin 56 is also mounted for driven rotation between formed mounting projections 108 and 110. A third idling roller 120 is mounted between mounting projections 108 and 110. Idling roller 120 receives a drive belt 122 which is connected to a drive shaft 124 (FIG. 7) mounted within frame 90. Drive shaft 124 and belt 122 are rotated by means of right angle metered gearing 126 to a take up motor drive shaft 128 and motor 130. Take up motor 130 as shown in FIG. 7 is controlled by means of limit switch 132 mounted atop frame 90 between peel back notch 106 and mounting projection 110. Limit switch 132 includes a trip lever 134. As drive belt 122 frictionally engages and rotates take up bobbin 56, bobbin 56 rotates to take up peeled cover tape 46 until tape 46 is tensioned between bobbin 56 and the rearward edge of peel back notch 106. In the tensioned position shown in FIG. 7, the tensioned cover tape 46 engages trip lever 134 and deflects it to turn off the tape up motor 130. As the carrier tape 42 is advanced forwardly in feed path 38 to present another pocket 44 at pick up station 12, the tension on peeled cover tape 46 is relaxed which releases trip lever 134 which causes take up motor 130 to be turned on again.

Referring now to FIGS. 7 and 8, feed path 38 includes a forward end 136 wherein the tape feed path makes a 180 degree hairpin turn around a pair of opposed drive wheels 52, 54 and opposed pair of frictional engagement rollers 138 and 140. The frictional engagement rollers 138 and 140 push the edge portions 82 and 84 of the tape against drive wheels 52 and 54 so that upon counterclockwise rotation of the drive wheels 52 and 54 the tape 42 is pulled forwardly along the tape path 38 to present depending pockets 44 one at a time at the pick up station 12. Opposed drive wheels 52 and 54 are interconnected by a drive shaft 142. The tension between the drive wheels 52 and 54 and friction rollers 138 and 140 may be adjusted by tension adjustment rollers 144 and 146.

Referring now to FIG. 8, the drive means for indexing or advancing the carrier tape 42 through the tape feeder 36 is shown. The drive wheels 52 and 54 are fixedly mounted on the opposite ends of drive shaft 142. Drive shaft 142 includes a right angle or miter gear 148 positioned at an intermediate point thereof. Right angle drive gear 148 meshes with a mating mitered right angle gear 150 provided on a drive shaft 152 which is in turn rotatably mounted to tape drive motor 50 as shown. Drive motor 50 rotates the drive shaft 142 in either a clockwise or counterclockwise direction in response to electronic signals received from the drive control module 80. In this manner the frictional drive wheels 52 and 54 may advance carrier tape 42 past the pick up station 12 or may reverse tape 42 along tape feeder path 38 to unload a carrier assembly.

In accordance with the present invention the tape drive control means 80 responds to a signal from the vision control system 70 of the robot 20 to turn the tape drive motor 50 on to advance the tape 42 to index the next pocket 44 into position. The new and improved component feeder 36 relies only on frictional engagement of the drive wheels 52 and 54 against the edge portions 82 and 84 of the carrier tape 52 to drive the tape 42 to generally locate a pocket 44 at the pick up station.

In accordance with the present invention an improvement in the component feeder 38 is provided in the form of an optical sensor 154 which is positioned at the underside of the tape feed groove 102 at pick up station 12 as shown in FIG. 7. Optical sensor 154 includes a spaced optical transmitter and optical receiver (not shown) positioned on one side of the tape feed path 38.

In accordance with this aspect of the invention, the optical trasmitter sends an angled light beam into the vicinity below the pick up station 12. As a depending pocket 44 is indexed into the pick up station 12 the end walls 86 will reflect the light beam back to the optical receiver also positioned in the optical sensor 154. The optical proximity sensor 154 receives the reflected light until the pocket 44 has been advanced out of a reflecting position. This signals that a pocket 44 has been indexed into the pick up station 12. The optical sensor 154 thereby sends a pulsed signal to the tape drive control means 80 to stop the tape drive motor 50.

Alternative optical sensing arrangements may be used besides a proximity sensor 154. For example, an optical transmitted can be positioned on the one side of the tape feed path 38 and an optical receiver disposed on the opposed side thereof in an aligned position to receive the light beam transmitted from the transmitter. As a tape pocket 44 is indexed into position at the pick up station 12, it will interrupt the beam sent from the transmitter to the receiver to break the optical circuit. The optical sensing means is positioned to be interrupted by the advancing pocket 44 and end wall portion 86 of the connector pocket 44 may be coated or provided with light opaque material to interrupt the light beam or, connectors 14 within the pocket 44 may interrupt the light beam. In accordance with this alternate sensing arrangement, the beam interruption signal is received by the tape drive control means 80 which turns tape drive motor 50 off. Regardless of the optical sensing means used, the signal is transmitted to the tape drive control means 80 which stops the tape drive motor 50 thereby generally positioning the pocket 44 with connectors 14 loaded therein at the pick up station 12 for pick up by the robot arm 20.

In the preferred embodiment shown in FIGS. 7 and 8, component feeder 36 will also include a back lighting arrangement for illuminating the underside of the carrier tape 42 at the pick up station 12. Back lighting may be provided by fluorescent lamp 156 as shown. Back lighting at the pick up station 12 is preferred to enhance the vision control system's ability to resolve the pocket 44 and the connectors 14 located at the pick up station 12.

In accordance with the present invention as the vision control system 70 on the robot 20 knows it is picked up the last connector 14 within a pocket 44, it signals the tape drive control 80 to turn drive motor 50 on. The drive motor 50 advances the tape 42 until a pocket 44 is sensed by optical sensor 154 located at the pick up station 12 which sends a signal to the tape drive control 80 to turn the tape drive motor 50 off. The tape drive motor control 80 sends an interactive signal back to the vision system 70 that a new pocket 44 has been presented.

In accordance with the present invention, a new and improved arrangement for providing a large number of electrical components to a robotic pick up station in a visually controlled robotic placement apparatus has been provided. Although the present invention has been described with reference to a preferred embodiment, modificatiions or changes may be made therein by those skilled in this art. For example, instead of an optical sensing means being disposed in position for interruption by the advancing pocket, a metallic insert can be placed on the end wall 86 and a proximity sensor for sensing metal may be provided in lieu of the optical sensing means 154. Moreover, in the parts acquisition step, instead of programming the vision control system 70 to find the first edge of the first connector 14 to position the gripper jaws 66 for pick up, any other visually disinctive feature of the connector 14 may be used to positively locate the connector 14 and the pocket 44. In the example shown in the preferred embodiment, wherein the carrier 40 and feeder 36 are providing D-subminiature type connectors 14, the metallic front shell provided on the D-subminiature connector may provide the reflective visually distinguishing feature that may be used in programming to assist the vision control means to direct the robot arm to pick up part in an appropriate location. Similarly other visibly distinct features may also be used to assist the vision control means for picking up the part within a pocket. All such obvious modifications in the arrangement may be made herein by those skilled in this art without departing from the scope and spirit of the present invention as defined by the appended claims:

We claim:

1. In an arrangement for automatically moving electrical components from a first station to a second station, said arrangement including:

a first station whereat a plurality of electrical components are delivered for movement;

component feeder means for supplying electrical components to said first station, said feeder means including a reeled carrier supply of electrical components having a continuous carrier tape with spaced apart component-receiving pockets defined therein extending the length thereof, electrical components disposed in said pockets; and indexing means for positioning one pocket at a time at said first station;

a second station spaced from said first station whereat electrical components moved from said first station are positioned;

robotic mover means including a robot arm having a free end; gripper means for gripping an electrical component mounted on said free end, said gripper means being actuable between a closed gripping position and an open release position; gripper control means for actuating said gripper means between said open and closed positions; and arm drive means for moving the free end and gripper means between said first station and said second station;

vision system control means for obtaining visual information at the first and second stations, analyzing said information and directing the robot arm drive means and gripper control means on the basis of said analyzed visual information; and the improvement in said component feeder means comprising:

each pocket including a plurality of similar electrical components disposed therein in a single orientation;

said indexing means including a carrier tape drive path extending through said first station, tape drive means for moving the carrier tape along said drive path toward the first station actuable between an on position and an off position, drive control means for actuating the tape drive means between said on and off positions, optical sensing means disposed adjacent said drive path at said first station for sensing when a pocket is located at said first station, whereupon said drive control means actuates the tape drive means to said off position in response thereto; and said drive control means actuating the tape drive to said on position in response to a direction from said vision system control means.

2. The arrangement of claim 1, wherein said tape drive means includes a tape drive motor and a pair of tape drive wheels positioned for frictional engagement with said carrier tape along the drive path, said drive wheels being rotatable in a clockwise or counterclockwise direction by means of said tape drive motor.

3. The arrangement of claim 1, wherein said optical sensing means includes an optical proximity sensor disposed at the first station along the underside of said tape drive path for sensing a depending pocket extending from the carrier tape in said drive path at the first station.

4. The arrangement of claim 1, further including illumination means in said indexing means disposed below said tape drive path adjacent the first station for back lighting a pocket positioned at the first station.

5. A method for automatically moving electrical components from a first station to a second station, said method including the steps of providing a first station whereat a plurality of electrical components are delivered for movement;

providing a reeled carrier supply of electrical components including a continuous carrier tape having spaced apart component receiving pockets defined therein extending the length thereof with electrical components in said pockets;

intermittently driving said carrier tape along a drive path extending through the first station to position one pocket at a time to said first station;

providing a second station spaced from said first station whereat electrical components moved from said first station are positioned; and providing a vision system controlled robotic placement means including gripper means for gripping an electrical component from a pocket at the first station and moving it to the second station and positioning and releasing the electrical component at the second station;

the improvement in said intermittent driving step comprising;

providing a plurality of electrical components in each pocket;

optically sensing the presence of a pocket generally at the first station;

stopping the carrier tape in response to said optical sensing to provide a pocket generally at the first station;

using the vision system control to locate the pocket and the electrical components in the pocket at the first station;

robotically moving the electrical components in the pocket at the first station one at a imte until the last electrical component is being moved; and starting the carrier tape in response to a signal from the vision system control that the last electrical component is being moved to drive the next pocket to the first station.

* * * * *